United States Patent
Jeong et al.

(10) Patent No.: US 9,166,201 B2
(45) Date of Patent: Oct. 20, 2015

(54) METHOD FOR MANUFACTURING ORGANIC LIGHT EMITTING DIODE DISPLAY AND METHOD FOR MANUFACTURING TOUCH PANEL

(71) Applicant: Samsung Display Co., Ltd., Yongin, Gyeonggi-Do (KR)

(72) Inventors: Beung Hwa Jeong, Cheonan-si (KR); Hong Ro Lee, Seongnam-si (KR); Chang Mo Park, Hwaseong-si (KR); Yo Seoph Ko, Ansan-si (KR); Dong Min Lee, Yongin-si (KR); Sung Hoon Hong, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/191,594

(22) Filed: Feb. 27, 2014

(65) Prior Publication Data

US 2015/0072449 A1     Mar. 12, 2015

(30) Foreign Application Priority Data

Sep. 9, 2013 (KR) ........................ 10-2013-0107951

(51) Int. Cl.
| | | |
|---|---|---|
| G06F 3/041 | (2006.01) | |
| H01L 51/56 | (2006.01) | |
| B32B 37/24 | (2006.01) | |
| B32B 38/00 | (2006.01) | |
| B32B 38/10 | (2006.01) | |

(52) U.S. Cl.
CPC ................ *H01L 51/56* (2013.01); *B32B 37/24* (2013.01); *B32B 38/0004* (2013.01); *B32B 38/10* (2013.01); *G06F 3/041* (2013.01); *B32B 2037/246* (2013.01); *B32B 2457/206* (2013.01); *B32B 2457/208* (2013.01); *H01L 2227/323* (2013.01)

(58) Field of Classification Search
CPC ........ C30B 33/00; B44C 1/22; H01L 27/323; G06F 3/041
USPC ........... 345/82, 173–175; 445/24, 46; 216/23, 216/31, 83, 88; 249/156; 349/139
See application file for complete search history.

(56) References Cited

U.S. PATENT DOCUMENTS

| | | |
|---|---|---|
| 2006/0250559 A1 | 11/2006 | Bocko et al. |
| 2012/0103520 A1 | 5/2012 | Lee et al. |
| 2012/0263945 A1 * | 10/2012 | Yoshikawa ..................... 428/337 |

FOREIGN PATENT DOCUMENTS

| | | |
|---|---|---|
| KR | 1020120037665 A | 4/2012 |
| KR | 10-1233687 B1 | 2/2013 |

* cited by examiner

*Primary Examiner* — Selim Ahmed
*Assistant Examiner* — Changhyun Yi
(74) *Attorney, Agent, or Firm* — Cantor Colburn LLP

(57) ABSTRACT

A manufacturing method of an organic light emitting diode ("OLED") display includes: forming a contact pattern on a panel region of a surface of a board glass, where the board glass includes the panel region, and a peripheral area which surrounds the panel region; contacting the paper glass with a surface of the contact pattern corresponding to the panel region and the surface of the board glass corresponding to the peripheral area; adhering the surface of the board glass corresponding to the peripheral area to a surface of the paper glass; forming an organic light emitting element on the paper glass corresponding to the panel region; and separating the paper glass from the board glass by cutting the paper glass at a position corresponding to an end portion of the panel region adjacent to the peripheral area.

11 Claims, 13 Drawing Sheets

METHOD FOR MANUFACTURING ORGANIC LIGHT EMITTING DIODE DISPLAY AND METHOD FOR MANUFACTURING TOUCH PANEL

This application claims priority to Korean Patent Application No. 10-2013-0107951 filed on Sep. 9, 2013, and all the benefits accruing therefrom under 35 U.S.C. §119, the entire contents of which are incorporated herein by reference.

BACKGROUND (a) Field

The invention relates to a manufacturing method of an organic light emitting diode ("OLED") display and a manufacturing method of a touch panel. More particularly, the invention relates to a manufacturing method of an OLED display and a touch panel including a very thin paper glass.

(b) Description of the Related Art

Organic light emitting diode ("OLED") displays have received much attention as display devices for displaying images.

An OLED display has a self-emission characteristic and does not employ a separate light source, unlike a liquid crystal display ("LCD") device, and thus can be fabricated to be thinner and lighter than a display device employing a separate light source. Further, the OLED display has high quality characteristics such as low power consumption, high luminance, high response speed, and the like.

In general, the OLED display includes a substrate, and an OLED provided on the substrate.

An OLED display including a relatively very thin paper glass has been developed.

SUMMARY

One or more exemplary embodiment of the invention provides a manufacturing method of an organic light emitting diode ("OLED") display and a touch panel, having advantages of easily forming organic light emitting elements and touch sensing elements on a paper glass serving as a substrate of the OLED display and the touch panel, respectively.

An exemplary embodiment of the invention provides a manufacturing method of an organic light emitting diode ("OLED") display, including: forming a first contact pattern on a first panel region of a surface of a first board glass, where the first board glass includes the first panel region at a center portion thereof, and a first peripheral area which surrounds the first panel region; contacting a first paper glass with a surface of the first contact pattern corresponding to the first panel region and the surface of the first board glass corresponding to the first peripheral area; adhering the surface of the first board glass corresponding to the first peripheral area to a surface of the first paper glass; forming an organic light emitting element on the first paper glass corresponding to the first panel region; and separating the first paper glass from the first board glass by cutting the first paper glass at a position corresponding to an end portion of the first panel region adjacent to the first peripheral area.

A thickness of the first paper glass may be smaller than that of the first board glass.

The first paper glass may have a thickness in a range of about 0.01 millimeter (mm) to about 0.1 mm, and the first board glass may have a thickness in a range of about 0.3 mm to about 1 mm.

The forming the first contact pattern on the first panel region of the surface of the first board glass may include: forming first contact material layer on an entire surface of the first board glass; and removing a portion of the first contact material layer corresponding to the first peripheral area, to expose the surface of the first board glass corresponding to the first peripheral area and form the first contact pattern which exposes the surface of the first board glass corresponding to the first peripheral area.

The contact pattern may include an oxide.

The oxide may include aluminum doped zinc oxide ("AZO").

The adhering the surface of the first board glass corresponding to the first peripheral area to the surface of the first paper glass may include heating the first paper glass which is in contact with the first board glass.

The manufacturing method may further include: forming a second contact pattern on a second panel region of a surface of a second board glass, where the second board glass includes the second panel region at a center portion thereof, and a second peripheral area which surrounds the second panel region; contacting a second paper glass with a surface of the second contact pattern corresponding to the second panel region and the surface of the second board glass corresponding to the second peripheral area; adhering the surface of the second board glass corresponding to the second peripheral area to a surface of the second paper glass; forming a touch panel sensing wire on the second paper glass corresponding to the second panel region; separating the second paper glass from the second board glass by cutting the second paper glass at a position corresponding to an end portion of the second panel region adjacent to the second peripheral area; and adhering the separated second paper glass to the separated first paper glass.

Another exemplary embodiment of the invention provides a manufacturing method of a touch panel, including: forming a first contact pattern on a first panel region of a surface of a first board glass, where the first board glass includes the first panel region at a center portion thereof, and a first peripheral area which surrounds the first panel region; contacting the first paper glass with a surface of the first contact pattern corresponding to the first panel region and the surface of the first board glass corresponding to the first peripheral area; adhering the surface of the first board glass corresponding to the first peripheral area to a surface of the first paper glass; forming a touch sensing wire on the first paper glass corresponding to the first panel region; and separating the first paper glass from the first board glass by cutting the first paper glass at a position corresponding to an end portion of the first panel region adjacent to the first peripheral area.

Yet another embodiment of the invention provides a manufacturing method of an OLED display, including: forming a first contact pattern on a first panel region of a surface of a first board glass, where the first board glass includes the first panel region at a center portion thereof, and a first peripheral area which surrounds the first panel region; contacting a first paper glass with a surface of the first contact pattern corresponding to the first panel region and the surface of the first board glass corresponding to the first peripheral area; adhering the surface of the first board glass corresponding to the first peripheral area to a surface of the first paper glass; forming a touch panel sensing wire on the first paper glass corresponding to the first panel region; separating the first paper glass from the first board glass by cutting the first paper glass at a position corresponding to an end portion of the first panel region adjacent to the first peripheral area; providing a second board glass comprising an organic light emitting element on a front surface thereof; adhering the separated first paper glass to the second board glass; and removing a thickness portion of the second board glass by etching a rear surface of the second board glass to reduce a thickness of the second board glass and form a second paper glass from the second board glass.

In accordance with one or more of the exemplary embodiments of the invention, a manufacturing method of an OLED display and a manufacturing method of a touch panel is provided, in which forming organic light emitting elements or touch sensing wires on a paper glass serving as a substrate is simplified and damage to the paper glass is reduced or effectively prevented.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
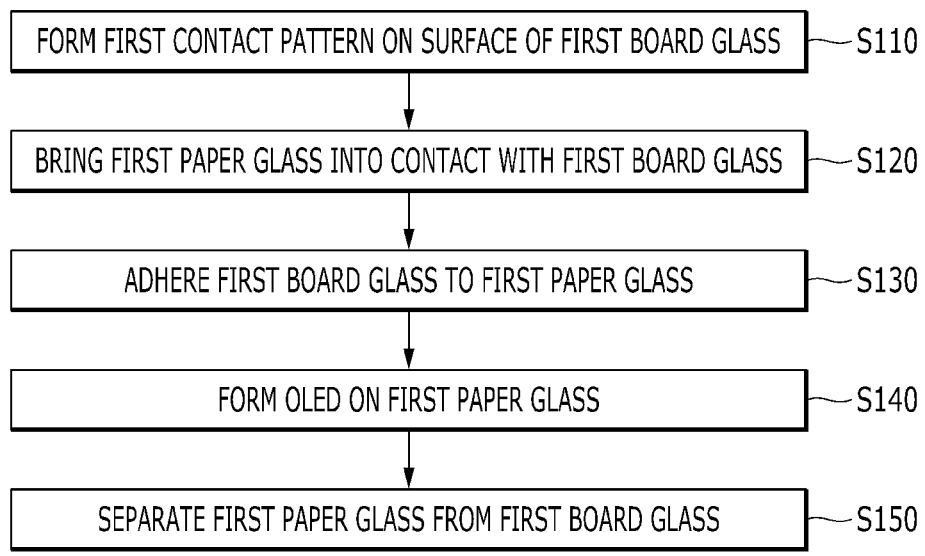
FIG. 1 is a flowchart showing an exemplary embodiment of a manufacturing method of an organic light emitting diode ("OLED") display in accordance with the invention.

In the following detailed description, only certain exemplary embodiments of the t invention have been shown and described, simply by way of illustration. As those skilled in the art would realize, the described embodiments may be modified in various different ways, all without departing from the spirit or scope of the invention.

In the drawings and this specification, parts or elements that are not related to the description hereof are omitted in order to clearly describe the invention, and the same or like constituent elements are designated by the same reference numerals throughout the specification.

For various exemplary embodiments, constituent elements having the same constitutions are designated by the same reference numerals and are explained representatively in one exemplary embodiment. In the other exemplary embodiments, only constituent elements different from those in the one exemplary embodiment are described. As used herein, the term "and/or" includes any and all combinations of one or more of the associated listed items.

In addition, the size and thickness of each component shown in the drawings are arbitrarily shown for better understanding and ease of description, but the invention is not limited thereto.

In the drawings, the thickness of layers, films, panels, regions, etc., are exaggerated for clarity. In the drawings, for better understanding and ease of description, the thickness of some layers and areas is exaggerated. When a first part of a layer, a film, a plate, or the like is described as being arranged "on" or "over" a second part, this indicates that the first part is arranged on or over the second part directly or with a third part therebetween without the limitation to the upper side thereof on the basis of the gravity direction.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Further, throughout this specification, when a part is described as "comprising (or including)" constituent elements, this indicates that the part may further include other constituent elements unless particularly otherwise defined. Furthermore, when the first part is described as being arranged "on" the second part, this indicates that the first part is arranged at an upper side or a lower side of the second part without the limitation to the upper side thereof on the basis of the gravity direction.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

When a substrate of a display device or a touch-sensing device is formed of a relatively very thin paper glass, forming organic light emitting elements of an organic light emitting diode ("OLED") display and touch sensing elements of a touch panel thereon may be difficult due to defects of the paper glass. For example, edge curling caused by static electricity or breakage may be generated in the paper glass during a process for forming the elements on the paper glass. Therefore, there remains a need for an improved method of manufacturing an OLED display and a touch panel, to reduce or effectively prevent defects in the OLED display and the touch panel.

Hereinafter, the invention will be described in detail with reference to the accompanying drawings.

A manufacturing method of an OLED display in accordance with the invention will now be described with reference to FIG. 1 to FIG. 4.

Figure 2:
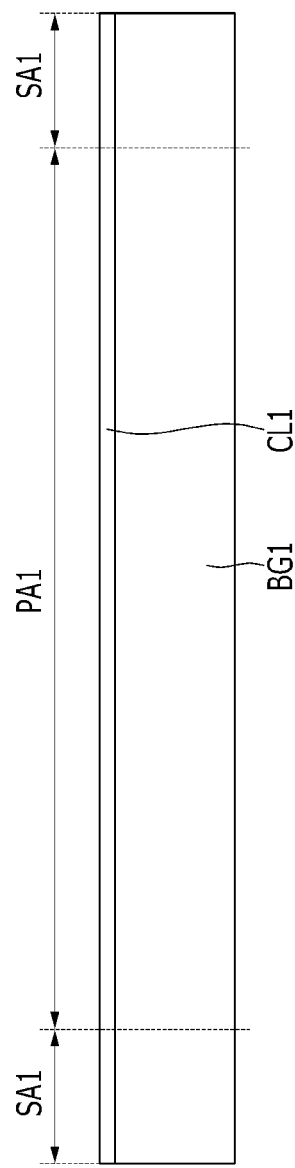
FIG. 2 to FIG. 4 are cross-sectional views showing an exemplary embodiment of an OLED display formed using the manufacturing method of an OLED display of FIG. 1, in accordance with the invention.
Figure 3:
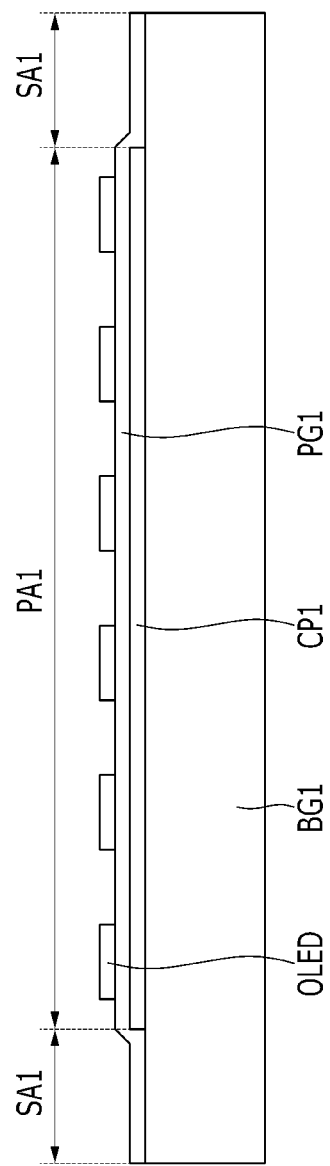
Figure 4:
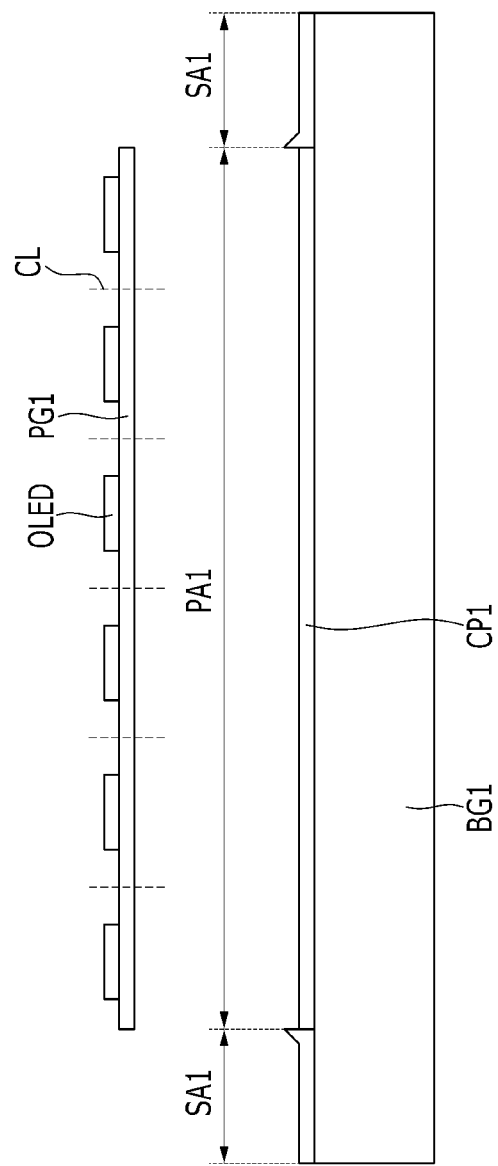

FIG. 1 is a flowchart showing an exemplary embodiment of a manufacturing method of an OLED display in accordance with the invention. FIG. 2 to FIG. 4 are cross-sectional views showing an exemplary embodiment of an OLED display formed using the manufacturing method of an OLED display of FIG. 1, in accordance with the invention.

As shown in FIG. 1 to FIG. 3, a first contact pattern CP1 is formed on a surface of a first board glass BG1 (S110).

Specifically, as shown in FIG. 2, a first contact material layer CL1 is formed on an entire surface of the first board glass BG1 including a first panel region PA1 located at substantially a center of the OLED display and a first peripheral area SA1 which surrounds the first panel region PA1. The first contact material layer CL1 may be formed on the surface of the first board glass BG1 by using a deposition process such as a sputtering method or a chemical vapor deposition method.

The first contact material layer CL1 may include an oxide, and the oxide may include aluminum doped zinc oxide ("AZO"), indium tin oxide ("ITO") a silicon oxide ("SiOx") or a combination thereof. The first contact material layer CL1 may include a nitride such as a silicon nitride ("SiNx").

The first peripheral area SA1 of the first board glass BG1 may be defined at an outer edge area (e.g., a frame side) of the first board glass BG1 to surround the first panel region PA1 in a closed loop shape along the outer edge area of the first panel region PA1. The first board glass BG1 may have a cross-sectional thickness in a range of about 0.3 millimeter (mm) to about 1 mm. In one exemplary embodiment, the first board glass BG1 may have a cross-sectional thickness of about 0.5 mm.

As shown in FIG. 3, the surface of the first board glass BG1 corresponding to the first peripheral area SA1 of the first board glass BG1 is exposed by removing a portion of the first contact material layer CL1 corresponding to the first peripheral area SA1. The first contact material layer CL1 corresponding to the first peripheral area SA1 may be removed from the first board glass BG1 by using an etching process such as dry etching or wet etching. The dry or wet etching may use a mask disposed over and covering the first contact material layer CL1 corresponding to the first panel region PA1.

The first contact pattern CP1 which covers (e.g., overlaps) only the first panel region PA1 of the first board glass BG1 is formed by removing the first contact material layer CL1 corresponding to the first peripheral area SA1. The first contact pattern CP1 may include an oxide, and the oxide may include AZO, ITO, SiOx or a combination thereof. The first contact pattern CP1 may include a nitride such as a SiNx.

Referring again to FIG. 1 and FIG. 3, the first paper glass PG1 is brought into contact with the first board glass BG1 (S120).

Specifically, the first paper glass PG1 is located on the first board glass BG1 to bring the first paper glass PG1 into contact with a surface of the first contact pattern CP1 corresponding to the first panel region PA1 and the exposed surface of the first board glass BG1 corresponding to the first peripheral area SA1.

The first paper glass PG1 has a cross-sectional thickness which is smaller than that of the first board glass BG1, and may have a cross-sectional thickness in a range of about 0.01 mm to about 0.1 mm. In one exemplary embodiment, the first paper glass PG1 may have a cross-sectional thickness of about 0.01 mm.

The first board glass BG1 is adhered to the first paper glass PG1 (S130).

Specifically, the exposed surface of the first board glass BG1 corresponding to the first peripheral area SA1 is adhered to a surface of the first paper glass PG1 such as by heating the first paper glass PG1 which is in contact with the surface of the first board glass BG1 corresponding to the first peripheral area SA1. In an exemplary embodiment of heating the first paper glass PG1, the exposed surface of the first board glass BG1 corresponding to the first peripheral area SA1 and the surface of the first paper glass PG1 in contact with the exposed surface of the first board glass BG1 are adhered to each other by heat applied from outside the stacked structure in a state in which the first paper glass PG1 contacts the first board glass BG1. In heating the first paper glass PG1, the surface of the first contact pattern CP1 corresponding to the first panel region PA1 and the surface of the first paper glass PG1 are not adhered to each other by the heat applied from the outside in a state in which the first paper glass PG1 and the first contact pattern CP1 are in contact with each other.

An OLED is formed on the first paper glass PG1 (S140).

Specifically, the OLED is formed on the first paper glass PG1 in a state in which the first paper glass PG1 is adhered to and supported by the first board glass BG1. The OLED may include a pixel circuit including a plurality of thin film transistors and at least one capacitor, a first electrode connected to the pixel circuit, an organic emission layer and a second electrode. The OLED may have one of various structures, and is not limited to these previously-described elements.

In an exemplary embodiment of forming the OLED on the first paper glass PG1, since the edge portion of the first paper glass PG1 corresponding to the first peripheral area SA1 is adhered to the first board glass BG1, a defect of the first paper glass PG1 such as edge curling of the first paper glass PG1 caused by static electricity or breakage of the first paper glass PG1 is reduced or effectively prevented during a process of forming the OLED. Accordingly, the OLED can be easily formed on the first paper glass PG1.

As shown in FIG. 4, the first paper glass PG1 is separated from the first board glass BG1 (S150).

Specifically, the first paper glass PG1 and the OLED thereon are separated from the first board glass BG1 by separating the first paper glass PG1 at a location thereof corresponding to an end portion of the first panel region PA1 adjacent to the first peripheral area SA1, such as by cutting. In other words, a portion of the first paper glass PG1 corresponding to the first panel region PA1 is easily separated from the first board glass BG1, since a first part of the first paper glass PG1 corresponding to the first panel region PA1 is in contact with but not adhered (e.g., fixed) to the first contact pattern CP1 while a second part of the first paper glass PG1 corresponding to the first peripheral area SA1 is in contact with and fixed to the first board glass BG1.

Before the first paper glass PG1 and the OLED thereon are separated from the first board glass BG1, a thin film encapsulator and/or an encapsulation substrate for encapsulating the OLED may be formed on the OLED. Thereafter, the first paper glass PG1 including the encapsulated OLED thereon may be separated from the first board glass BG1.

A plurality of OLED displays can be manufactured from one first paper glass PG1 on which a plurality of OLEDs are formed by cutting the first paper glass PG1 along cutting lines CL corresponding to edges of the OLEDs.

As such, the exemplary embodiment of the manufacturing method of an OLED display in accordance with the invention can easily form the OLEDs on the first paper glass PG1 and reduce or effectively prevent generation of a defect of the first paper glass PG1 such as breakage or curling of the first paper glass PG1 caused by static electricity during a process for forming the OLEDs, since the OLEDs are formed on the first paper glass PG1 in a state in which the first paper glass PG1 is adhered to only the first peripheral area SA1 of the first board glass BG1 by using the first contact pattern CP1 formed on only the first panel region PA1.

Further, one or more exemplary embodiment of the manufacturing method of an OLED display in accordance with the invention forms the OLEDs on the first paper glass PG1 in a state in which the first paper glass PG1 is adhered to only the first peripheral area SA1 of the first board glass BG1 by using the first contact pattern CP1 formed on only the first panel region PA1 and separating the first paper glass PG1 corresponding to the first panel region PA1 from the first board glass BG1. Accordingly, since the first paper glass PG1 corresponding to the first panel region PA1 is simply brought into contact with and not fixed to the first contact pattern CP1, the first paper glass PG1 can be very easily separated from the first board glass BG1. Therefore, defects such as breakage of the very thin first paper glass PG1 are minimized during a process in which the first paper glass PG1 is separated from the first board glass BG1.

In other words, one or more exemplary embodiment of the manufacturing method of an OLED display, with improved reliability and a simplified process for forming the OLED on the very thin first paper glass PG1, is provided.

Another manufacturing method of an OLED display in accordance with the invention will now be described with reference to FIG. 5 to FIG. 9.

Only features that are distinguished from those of the exemplary embodiment of FIG. 1 to FIG. 4 will be described, and parts of which the description is omitted are substantially the same as those of the exemplary embodiment of FIG. 1 to FIG. 4. In the exemplary embodiment of FIG. 5 to FIG. 9 according to the invention, for better comprehension and ease of description, the same constituent elements are designated by the same reference numerals as in the exemplary embodiment of FIG. 1 to FIG. 4.

Figure 5:
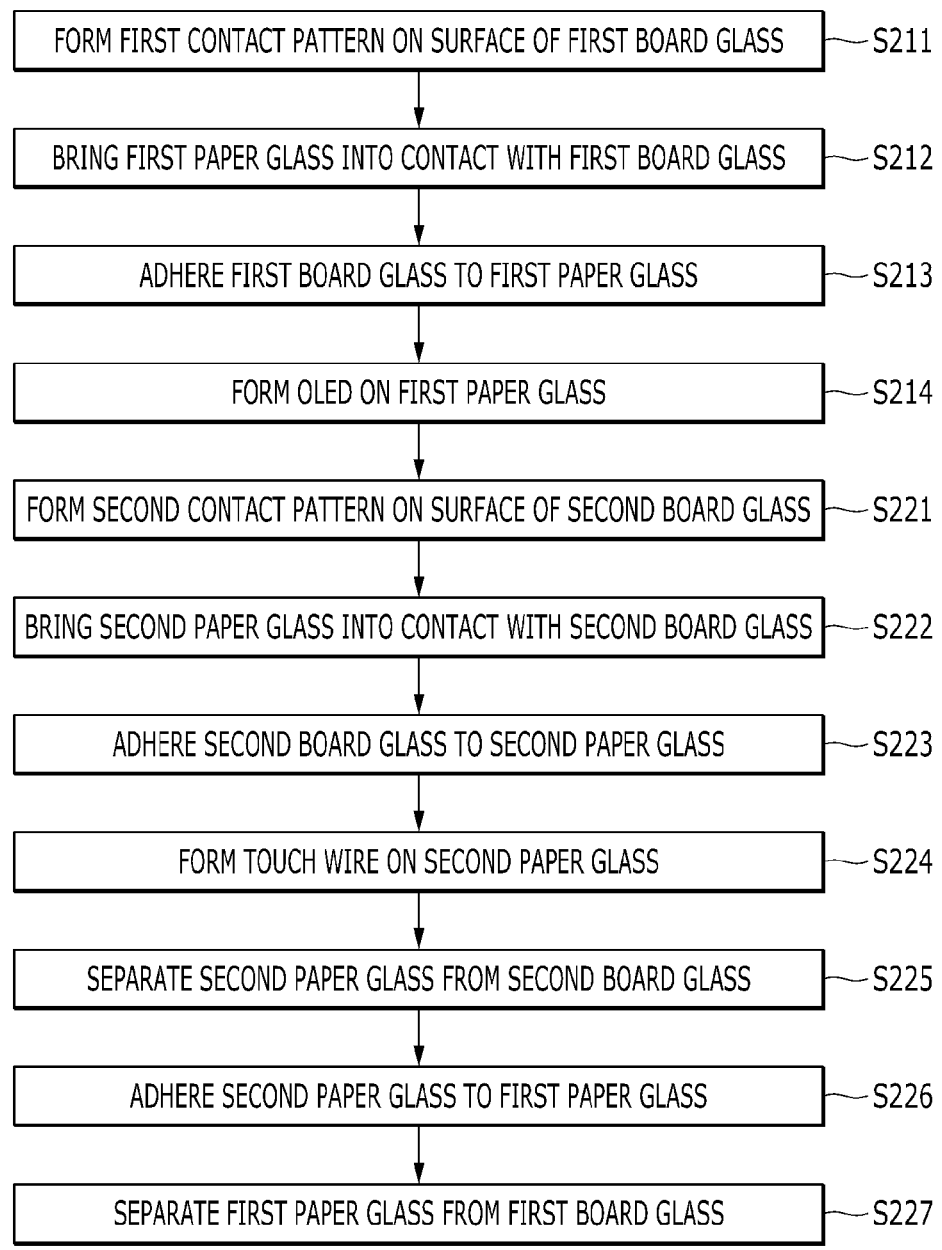
FIG. 5 is a flowchart showing another exemplary embodiment of a manufacturing method of an OLED display in accordance with the invention.

FIG. 5 is a flowchart showing another exemplary embodiment of a manufacturing method of an OLED display in accordance with the invention. FIG. 6 to FIG. 9 are cross-sectional views showing an exemplary embodiment of an OLED display formed using the manufacturing method of an OLED display of FIG. 5, in accordance with the invention.

Figure 6:
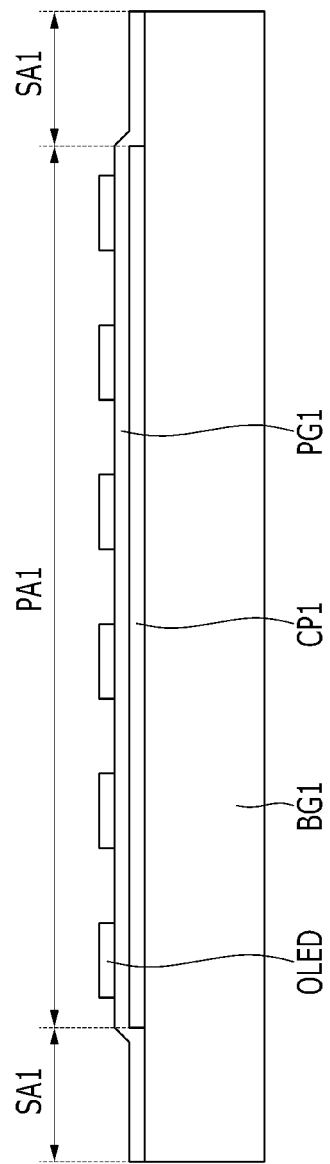
FIG. 6 to FIG. 9 are cross-sectional views showing an exemplary embodiment of an OLED display formed using the manufacturing method of an OLED display of FIG. 5, in accordance with the invention.

As shown in FIG. 5 and FIG. 6, a first contact pattern CP1 is formed on a surface of a first board glass BG1 (S211).

The first paper glass PG1 is brought into contact with the first board glass BG1 (S212).

The first board glass BG1 is adhered to the first paper glass PG1 (S213).

The OLED is formed on the first paper glass PG1 (S214).

Figure 7:
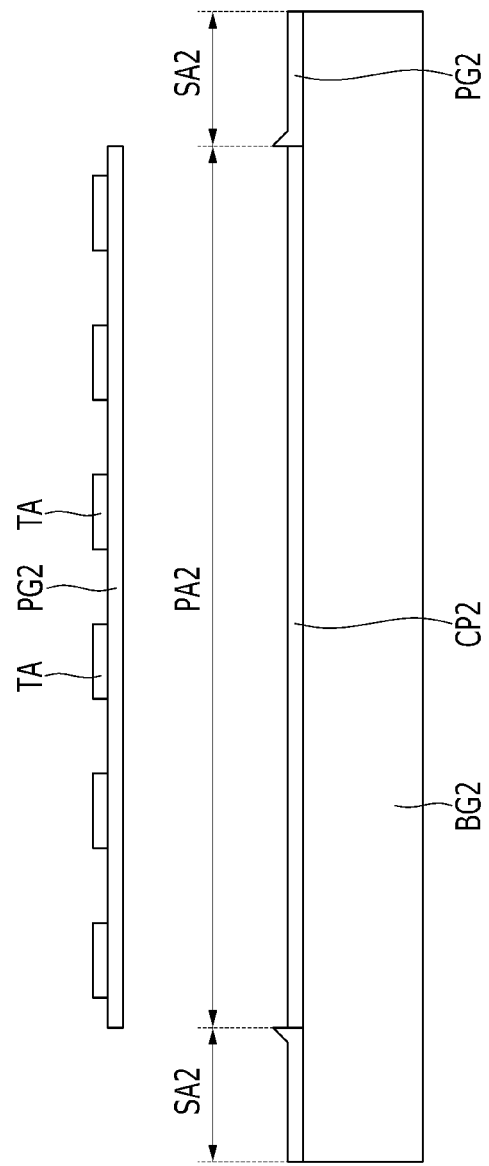

As shown in FIG. 7, a second contact pattern CP2 is formed on a surface of a second board glass BG2 (S221).

Specifically, a second contact material layer (not shown) is formed on an entire surface of the second board glass BG2 including a second panel region PA2 located at substantially a center of the OLED display and a second peripheral area SA2 which surrounds the second panel region PA2. The second contact material layer may be formed on the surface of the second board glass BG2 by using a deposition process such as a sputtering method or a chemical vapor deposition method.

The second contact material layer may include an oxide, and the oxide may include AZO, ITO, a SiOx or a combination thereof. The second contact material layer may include a nitride such as SiNx.

The second peripheral area SA2 of the second board glass BG2 may be defined at an outer edge (e.g., a frame side) of the second board glass BG2 to surround the second panel region PA2 in a closed loop shape along the outer edge of the second panel region PA2. The second board glass BG2 may have a cross-sectional thickness in a range of about 0.3 mm to about 1 mm. In one exemplary embodiment, the second board glass BG2 may have a cross-sectional thickness of about 0.5 mm.

A surface of the second board glass BG2 corresponding to the second peripheral area SA2 of the second board glass BG2 is exposed by removing a portion of the second contact material layer corresponding to the second peripheral area SA2. The second contact material layer corresponding to the second peripheral area SA2 may be removed from the second board glass BG2 by using an etching process such as dry etching or wet etching, which uses a mask disposed over the second contact material layer corresponding to the second panel region PA2.

The second contact pattern CP2 which covers only the second panel region PA2 of the second board glass BG2 is formed by removing the second contact material layer corresponding to the second peripheral area SA2. The second contact pattern CP2 may include an oxide, and the oxide may include AZO, ITO, a SiOx or a combination thereof. The second contact pattern CP2 may include a nitride such as a SiNx.

The second paper glass PG2 is brought into contact with the second board glass BG2 (S222).

Specifically, the second paper glass PG2 is located on the second board glass BG2 to bring the second paper glass PG2 into contact with a surface of the second contact pattern CP2 corresponding to the second panel region PA2 and the exposed surface of the second board glass BG2 corresponding to the second peripheral area SA2.

The second paper glass PG2 has a cross-sectional thickness smaller than that of the second board glass BG2, and may have a cross-sectional thickness in a range of about 0.01 mm to about 0.1 mm. In one exemplary embodiment, the second paper glass PG2 may have a cross-sectional thickness of about 0.01 mm.

The second board glass BG2 is adhered to the second paper glass PG2 (S223).

Specifically, the exposed surface of the second board glass BG2 corresponding to the second peripheral area SA2 is adhered to a surface of the second paper glass PG2 such as by heating the second paper glass PG2 which is in contact with the surface of the second board glass BG2 corresponding to the second peripheral area SA2. In an exemplary embodiment of heating the second paper glass PG2, the exposed surface of the second board glass BG2 corresponding to the second peripheral area SA2 and the surface of the second paper glass PG2 in contact with the exposed surface of the second board glass BG2 are adhered to each other by heat applied from outside the stacked structure in a state in which the second paper glass PG2 contacts the second board glass BG2. In heating the second paper glass PG2, a surface of the second contact pattern CP2 corresponding to the second panel region PA2 and the surface of the second paper glass PG2 are not adhered to each other by the heat applied from the outside in a state in which the second paper glass PG2 and the second contact pattern CP2 are in contact with each other.

A touch wire TA is formed on the second paper glass PG2 (S224).

Specifically, the touch or sensing wire TA is formed on the second paper glass PG2 in a state in which the second paper glass PG2 is fixed to and supported by the second board glass BG2. The touch wire TA may include a plurality of different layer transparent electrodes which intersect each other in a matrix shape, and insulation layers disposed between the intersecting transparent electrodes. The touch wire TA may serve as a touch sensor which recognizes a user touch thereto.

In an exemplary embodiment of forming the touch wire TA on the second paper glass PG2, since the edge portion of the second paper glass PG2 corresponding to the second peripheral area SA2 is adhered to the second board glass BG2, a defect of the second paper glass PG2 such as edge curling of the second paper glass PG2 caused by static electricity or breakage of the second paper glass PG2 is reduced or effectively prevented during a process of forming the touch wire TA. Accordingly, the touch wire TA can be easily formed on the second paper glass PG2.

The second paper glass PG2 is separated from the second board glass BG2 (S225).

Specifically, the second paper glass PG2 and the touch wire TA thereon are separated from the second board glass BG2 by separating the second paper glass PG2 at a location thereof corresponding to an end portion of the second panel region PA2 adjacent to the second peripheral area SA2, such as by cutting. In other words, a portion of the second paper glass PG2 corresponding to the second panel region PA2 is easily separated from the second board glass BG2, since a first part of the second paper glass PG2 corresponding to the second panel region PA2 is in contact with but not fixed to the second contact pattern CP2 while a second part of the second paper glass PG2 corresponding to the second peripheral area PA2 is in contact with and fixed to the second board glass BG2.

A touch panel may be manufactured by the aforementioned operations S221 to S225.

A plurality of touch panels can be manufactured from one second paper glass PG2 including a plurality of touch wires TA formed thereon by cutting the second paper glass PG2 at cutting lines located between adjacent touch wires TA.

Figure 8:
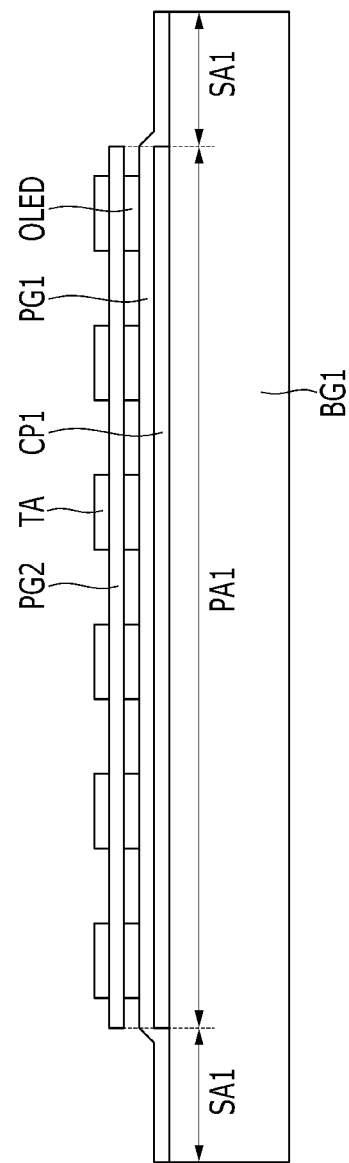

As shown in FIG. 8, the second paper glass PG2 is adhered to the first paper glass PG1 (S226). The paper glasses PG1 and PG2 may be adhered to each other with the first paper glass PG1 attached to the first board glass BG1.

Specifically, the second paper glass PG2 including the plurality of touch wires TA thereon is adhered to the first paper glass PG1 including the plurality of OLEDs thereon. Adhering the second paper glass PG2 and the first paper glass PG1 to each other may include applying a sealant such as a frit between adjacent OLEDs and between the first and second paper glasses PG1 and PG2.

Figure 9:
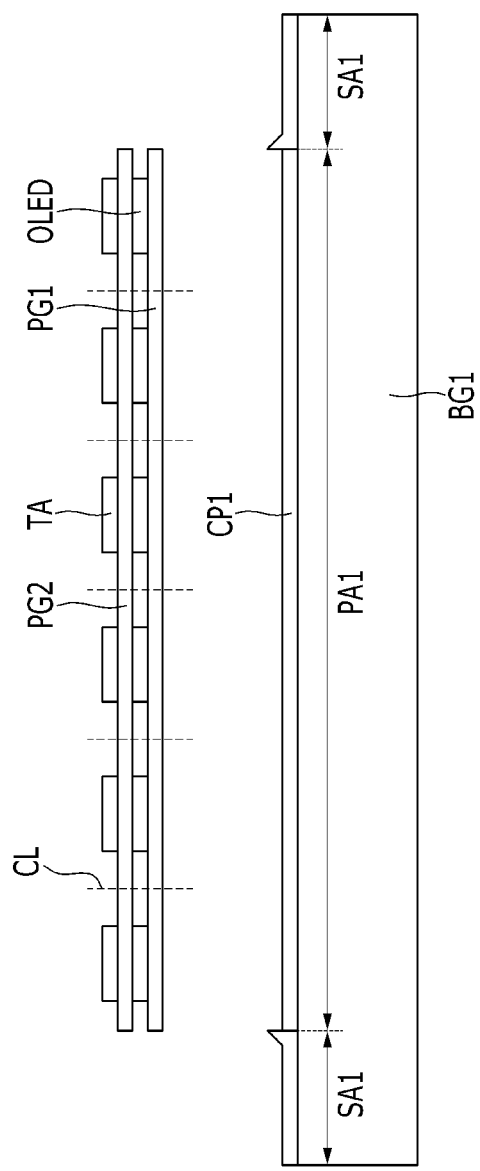

As shown in FIG. 9, the first paper glass PG1 is separated from the first board glass BG1 (S227).

Specifically, the first paper glass PG1 to which the second paper glass PG2 is adhered is separated from the first board glass BG1 by separating the first paper glass PG1 at a location thereof corresponding to an end portion of the first panel region PA1 adjacent to the first peripheral area SA1. In other words, a portion of the first paper glass PG1 corresponding to the first panel region PA1 is easily separated from the first board glass BG1, since a first part of the first paper glass PG1 corresponding to the first panel region PA1 is in contact with and not fixed to the first contact pattern CP1 while a second part of the first paper glass PG1 corresponding to the first peripheral area SA1 is in contact with and fixed to the first board glass BG1.

A plurality of OLED displays each including the touch wires TA and the OLEDs can be manufactured from one first paper glass PG1 on which a plurality of OLEDs are formed by cutting the first paper glass PG1 and the second paper glass PG2 along cutting lines CL corresponding to edges of areas occupied by the OLEDs and the touch wires TA of one OLED display, respectively.

As such, the exemplary embodiment of the manufacturing method of an OLED display in accordance with the invention can easily form the touch wires TA on the second paper glass PG2 and reduce or effectively prevent generation of a defect of the second paper glass PG2 such as breakage or curling of the second paper glass PG2 caused by static electricity during a process for forming the touch wires TA, since the touch wires TA are formed on the second paper glass PG2 in a state in which the second paper glass PG2 is adhered to only the second peripheral area SA2 of the second board glass BG2 by using the second contact pattern CP2 formed on only the second panel region PA2.

Further, one or more exemplary embodiment of the manufacturing method of an OLED display in accordance with the invention forms the touch wires TA on the second paper glass PG2 in a state in which the second paper glass PG2 is adhered to only the second peripheral area SA2 of the second board glass BG2 by using the second contact pattern CP2 formed on only the second panel region PA2 and separating the second paper glass PG2 corresponding to the second panel region PA2 from the second board glass BG2. Accordingly, since the second paper glass PG2 corresponding to the second panel region PA2 is simply brought into contact with and not fixed to the second contact pattern CP2, the second paper glass PG2 can be very easily separated from the second board glass BG2. Therefore, defects such as breakage of the very thin second paper glass PG2 are minimized during a process in which the second paper glass PG2 is separated from the second board glass BG2.

In other words, one or more exemplary embodiment of the manufacturing method of an OLED display, with improved reliability and a simplified process for forming the touch wire TA on the very thin second paper glass PG2 and forming the OLED on the very thin first paper glass PG1, is provided.

Still another manufacturing method of an OLED display in accordance with the invention will now be described with reference to FIG. 10 to FIG. 13.

Figure 10:
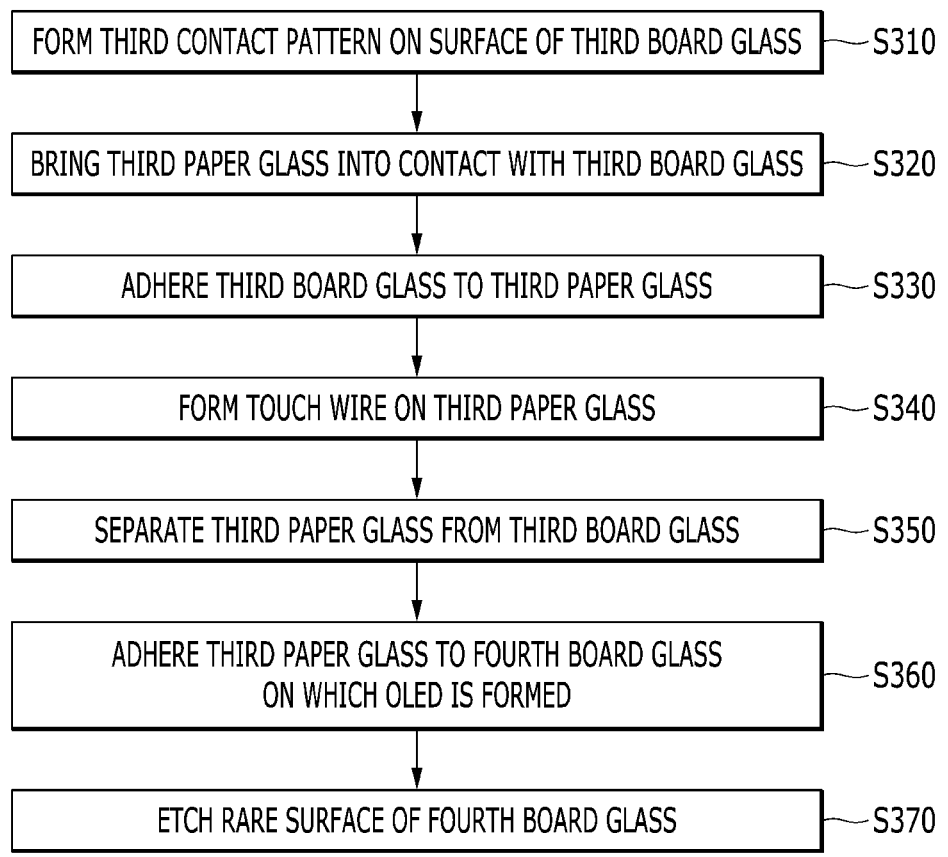
FIG. 10 is a flowchart showing still another exemplary embodiment of a manufacturing method of an OLED display in accordance with the invention.
Figure 11:
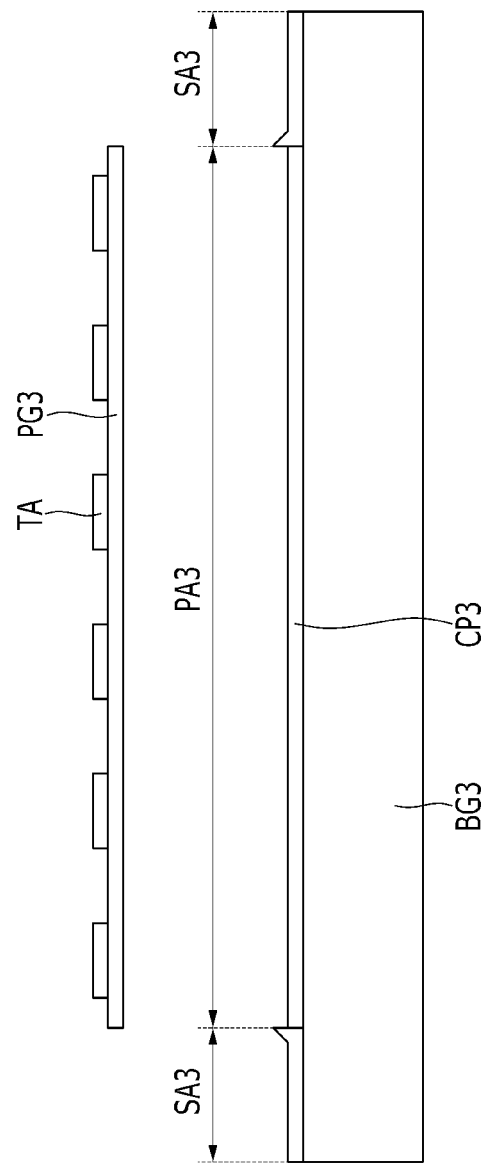
FIG. 11 to FIG. 13 are cross-sectional views showing an exemplary embodiment of an OLED display formed using the manufacturing method of an OLED display of FIG. 10, in accordance with the invention.
Figure 12:
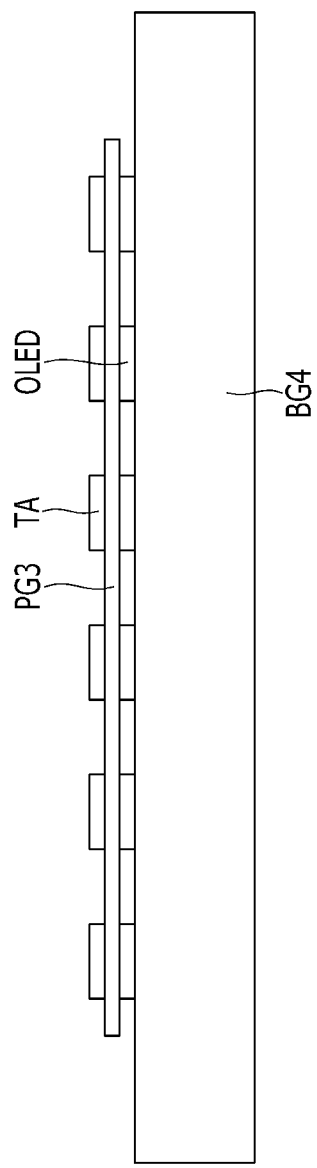
Figure 13:
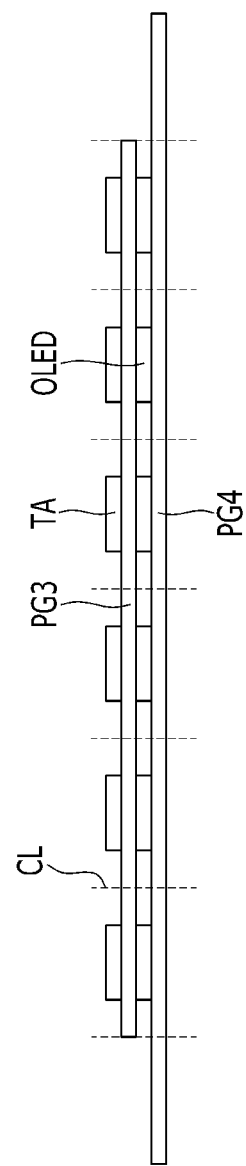

FIG. 10 is a flowchart showing still another exemplary embodiment of a manufacturing method of an OLED display in accordance with the invention. FIG. 11 to FIG. 13 are cross-sectional views showing an exemplary embodiment of an OLED display formed using the manufacturing method of an OLED display of FIG. 10 in accordance with the invention.

As shown in FIG. 10 and FIG. 11, a third contact pattern CP3 is formed on a surface of a third board glass BG3 (S310).

Specifically, a third contact material layer is formed on an entire surface of the third board glass BG3 including a third panel region PA3 located at substantially a center of the OLED display and a third peripheral area SA3 which surrounds the third panel region PA3. The third contact material layer may be formed on the surface of the third board glass BG3 by using a deposition process such as a sputtering method or a chemical vapor deposition method.

The third contact material layer may include an oxide, and the oxide may include AZO, ITO, a SiOx or a combination thereof. The third contact material layer may include a nitride such as a SiNx.

The third peripheral area SA3 of the third board glass BG3 may be defined at an outer edge (e.g., a frame side) of the third board glass BG3 to surround the third panel region PA3 in a closed loop shape along the outer edge of the third panel region PA3. The third board glass BG3 may have a cross-sectional thickness in a range of about 0.3 mm to about 1 mm. In one exemplary embodiment, the third board glass BG3 may have a cross-sectional thickness of about 0.5 mm.

A surface of the third board glass BG3 corresponding to the third peripheral area SA3 of the third board glass BG3 is exposed by removing a portion of the third contact material layer corresponding to the third peripheral area SA3. The third contact material layer corresponding to the third peripheral area SA3 can be removed from the third board glass BG3 by using an etching process such as dry etching or wet etching, which uses a mask disposed over the third contact material layer corresponding to the third panel region PA3.

The third contact pattern CP3 which covers only the third panel region PA3 of the third board glass BG3 is formed by removing the third contact material layer corresponding to the third peripheral area SA3. The third contact pattern CP3 may include an oxide, and the oxide may include AZO, ITO, a SiOx or a combination thereof. The third contact pattern CP2 may include a nitride such as SiNx.

The third paper glass PG3 is brought into contact with the third board glass BG3 (S320).

Specifically, the third paper glass PG3 is located on the third board glass BG3 to bring the third paper glass PG3 into contact with a surface of the third contact pattern CP3 corresponding to the third panel region PA3 and the exposed surface of the third board glass BG3 corresponding to the third peripheral area SA3.

The third paper glass PG3 has a cross-sectional thickness smaller than that of the third board glass BG3, and may have a cross-sectional thickness in a range of about 0.01 mm to about 0.1 mm. In one exemplary embodiment, the third paper glass PG3 may have a cross-sectional thickness of about 0.01 mm.

The third board glass BG3 is adhered to the third paper glass PG3 (S330).

Specifically, the exposed surface of the third board glass BG3 corresponding to the third peripheral area SA3 is adhered to a surface of the third paper glass PG3 such as by heating the third paper glass PG3 which is in contact with the exposed surface of the third board glass BG3 corresponding to the third peripheral area SA3. In an exemplary embodiment of heating the third paper glass PG3, the exposed surface of the third board glass BG3 corresponding to the third peripheral area SA3 and the surface of the third paper glass PG3 in contact with the exposed surface of the third board glass BG3 are adhered to each other by heat applied from outside the stacked structure in a state in which the third paper glass PG3 contacts the third board glass BG3. In heating the third paper glass PG3, a surface of the third contact pattern CP3 corresponding to the third panel region PA3 and the surface of the third paper glass PG3 are not adhered to each other by the heat applied from the outside in a state in which the third paper glass PG3 and the third contact pattern CP3 are in contact with each other.

A touch wire TA is formed on the third paper glass PG3 (S340).

Specifically, the touch (or sensing) wire TA is formed on the third paper glass PG3 in a state in which the third paper glass PG3 is fixed to and supported by the third board glass BG3. The touch wire TA may include a plurality of different layer transparent electrodes which intersect each other in a matrix shape and insulation layers disposed between the intersecting transparent electrodes. The touch wire TA may serve as a touch sensor which recognizes a user touch thereto.

In an exemplary embodiment of forming the touch wire TA on the third paper glass PG3, since the edge portion of the third paper glass PG3 corresponding to the third peripheral area SA3 is adhered to the third board glass BG3, a defect of the third paper glass PG3 such as edge curling of the third paper glass PG3 caused by static electricity or breakage of the third paper glass PG3 is reduced or effectively prevented during a process for forming the touch wire TA. Accordingly, the touch wire TA can be easily formed on the third paper glass PG3.

The third paper glass PG3 is separated from the third board glass BG3 (S350).

Specifically, the third paper glass PG3 and the touch wire TA thereon are separated from the third board glass BG3 by separating the third paper glass PG3 at a location corresponding to an end portion of the third panel region PA3 adjacent to the third peripheral area SA3, such as by cutting. In other words, a portion of the third paper glass PG3 corresponding to the third panel region PA3, is easily separated from the third board glass BG3, since a first part of the third paper glass PG3 corresponding to the third panel region PA3 is in contact with but not fixed to the third contact pattern CP3 while a second part of the third paper glass PG3 corresponding to the third peripheral area SA3 is in contact with and fixed to the third board glass BG3.

A touch panel may be manufactured by the aforementioned operations S310 to S350.

A plurality of touch panels can be manufactured from one third paper glass PG3 including a plurality of touch wires TA formed thereon by cutting the third paper glass PG3 at cutting lines located between adjacent touch wires TA.

As shown in FIG. 12, the third paper glass PG3 is adhered to a fourth board glass BG4 having OLEDs formed on a front surface thereof (S360).

Specifically, the third paper glass PG3 including the plurality of touch wires TA thereon is adhered to the fourth board glass BG4 including a plurality of OLEDs thereon. Adhering the third paper glass PG3 and the fourth board glass BG4 to each other may include by applying a sealant such as a frit between adjacent OLEDs and between the third paper glass PG3 and the fourth board glass BG4. The fourth board glass BG4 may have a cross-sectional thickness in a range of about 0.3 mm to about 1 mm. In one exemplary embodiment, the fourth board glass BG4 may have a cross-sectional thickness of about 0.5 mm.

As shown in FIG. 13, a rear surface of the fourth board glass BG4 is etched (S370).

Specifically, the rear surface of the fourth board glass BG4 opposite to the surface on which the OLEDs are disposed, is etched by using an etching process such as dry etching to reduce the cross-sectional thickness of the fourth board glass BG4. In an exemplary embodiment of etching the fourth board glass BG4, the fourth board glass BG4 is etched to form a fourth paper glass PG4 having a cross-sectional thickness in a range of about 0.01 mm to about 0.1 mm. In one exemplary embodiment, the fourth paper glass PG4 may have a cross-sectional thickness of about 0.01 mm.

A plurality of OLED displays each including the touch wires TA and the OLEDs can be manufactured from one fourth paper glass PG4 on which a plurality of OLEDs are formed by cutting the fourth paper glass PG4 and the third paper glass PG3 along cutting lines CL corresponding to edges of areas occupied by the OLEDs and the touch wires TA of one OLED display, respectively.

As such, the exemplary embodiment of the manufacturing method of an OLED display in accordance with the invention can easily form the OLEDs on the fourth paper glass PG4 and reduce or effectively prevent a defect of the fourth paper glass PG4 such as breakage or curling of the fourth paper glass PG4 caused by static electricity during a process for forming the OLEDs, by forming the OLEDs on the front surface of the fourth board glass BG4 and etching the rear surface of the fourth board glass BG4 to form the fourth paper glass PG4.

In other words, one or more exemplary embodiment of the manufacturing method of an OLED display, with improved reliability and a simplified process for forming the touch wire TA on the very thin third paper glass PG3 and forming the OLED on the very thin fourth paper glass PG4, is provided.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of an organic light emitting diode display, the method comprising:
    forming a first contact pattern on a first panel region of a surface of a first board glass, wherein the first board glass comprises the first panel region at a center portion thereof, and a first peripheral area which surrounds the first panel region;
    contacting a first paper glass with a surface of the first contact pattern corresponding to the first panel region and the surface of the first board glass corresponding to the first peripheral area;
    adhering the surface of the first board glass corresponding to the first peripheral area to a surface of the first paper glass;
    forming an organic light emitting element on the first paper glass corresponding to the first panel region; and
    separating the first paper glass from the first board glass by cutting the first paper glass at a position corresponding to an end portion of the first panel region adjacent to the first peripheral area.

2. The manufacturing method of claim 1, wherein a thickness of the first paper glass is smaller than that of the first board glass.

3. The manufacturing method of claim 2, wherein
    the first paper glass has a thickness in a range of about 0.01 millimeter to about 0.1 millimeter, and
    the first board glass has a thickness in a range of about 0.3 millimeter to about 1 millimeter.

4. The manufacturing method of claim 1, wherein
    the forming the first contact pattern on the first panel region of the surface of the first board glass comprises:
    forming a first contact material layer on an entire surface of the first board glass; and
    removing a portion of the first contact material layer corresponding to the first peripheral area, to expose the surface of the first board glass corresponding to the first peripheral area and form the first contact pattern which exposes the surface of the first board glass corresponding to the first peripheral area.

5. The manufacturing method of claim 1, wherein the first contact pattern comprises an oxide.

6. The manufacturing method of claim 5, wherein the oxide comprises aluminum doped zinc oxide.

7. The manufacturing method of claim 1, wherein the adhering the surface of the first board glass corresponding to the first peripheral area to the surface of the first paper glass comprises heating the first paper glass which is in contact with the first board glass.

8. The manufacturing method of claim 1, further comprising:
    forming a second contact pattern on a second panel region of a surface of a second board glass, wherein the second board glass comprises the second panel region at a center portion thereof, and a second peripheral area which surrounds the second panel region;
    contacting a second paper glass with a surface of the second contact pattern corresponding to the second panel region and the surface of the second board glass corresponding to the second peripheral area;
    adhering the surface of the second board glass corresponding to the second peripheral area to a surface of the second paper glass;
    forming a touch panel sensing wire on the second paper glass corresponding to the second panel region;
    separating the second paper glass from the second board glass by cutting the second paper glass at a position corresponding to an end portion of the second panel region adjacent to the second peripheral area; and
    adhering the separated second paper glass to the separated first paper glass.

9. The manufacturing method of claim 1, wherein the adhering the surface of the first board glass to the surface of the first paper glass comprises fixing only the surface of the first paper glass corresponding to the first peripheral area to the surface of the first board glass.

10. A manufacturing method of a touch panel, the method comprising:
    forming a first contact pattern on a first panel region of a surface of a first board glass, wherein the first board glass comprises the first panel region at a center portion thereof, and a first peripheral area which surrounds the first panel region;
    contacting the first paper glass with a surface of the first contact pattern corresponding to the first panel region and the surface of the first board glass corresponding to the first peripheral area;
    adhering the surface of the first board glass corresponding to the first peripheral area to a surface of the first paper glass;
    forming a touch sensing wire on the first paper glass corresponding to the first panel region; and
    separating the first paper glass from the first board glass by cutting the first paper glass at a position corresponding to an end portion of the first panel region adjacent to the first peripheral area.

11. A manufacturing method of an organic light emitting diode display, the method comprising:
    forming a first contact pattern on a first panel region of a surface of a first board glass, wherein the first board glass comprises the first panel region at a center portion thereof, and a first peripheral area which surrounds the first panel region;
    contacting a first paper glass with a surface of the first contact pattern corresponding to the first panel region and the surface of the first board glass corresponding to the first peripheral area;

adhering the surface of the first board glass corresponding to the first peripheral area to a surface of the first paper glass;

forming a touch panel sensing wire on the first paper glass corresponding to the first panel region;

separating the first paper glass from the first board glass by cutting the first paper glass at a position corresponding to an end portion of the first panel region adjacent to the first peripheral area;

providing a second board glass comprising an organic light emitting element on a front surface thereof;

adhering the separated first paper glass to the second board glass; and removing a thickness portion of the second board glass by etching a rear surface of the second board glass to reduce a thickness of the second board glass and form a second paper glass from the second board glass.

* * * * *